(12) United States Patent
Yang et al.

(10) Patent No.: US 9,196,669 B2
(45) Date of Patent: Nov. 24, 2015

(54) SEMICONDUCTOR SUBSTRATE AND METHOD FOR MANUFACTURING SEMICONDUCTOR SUBSTRATE

(71) Applicant: SAMSUNG ELECTRO-MECHANICS CO., LTD., Suwon (KR)

(72) Inventors: Ju Hwan Yang, Suwon (KR); Yong Suk Kim, Suwon (KR); Young Seuck Yoo, Suwon (KR); Sung Kwon Wi, Suwon (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/895,260

(22) Filed: May 15, 2013

(65) Prior Publication Data

US 2013/0320492 A1  Dec. 5, 2013

(30) Foreign Application Priority Data

May 30, 2012  (KR) .................. 10-2012-0057372

(51) Int. Cl.
*H01L 27/08* (2006.01)
*H01L 49/02* (2006.01)
*H01F 17/00* (2006.01)

(52) U.S. Cl.
CPC ............ *H01L 28/10* (2013.01); *H01F 17/0013* (2013.01); *H01F 2017/0066* (2013.01); *H01F 2017/0086* (2013.01)

(58) Field of Classification Search
USPC .................. 257/531, 277, E31.072, E21.022
See application file for complete search history.

(56) References Cited

U.S. PATENT DOCUMENTS 6,154,114 A     11/2000  Takahashi
2012/0112869 A1*  5/2012  Nishikawa et al. ........... 336/200

* cited by examiner

*Primary Examiner* — Timor Karimy
(74) *Attorney, Agent, or Firm* — McDermott Will & Emery LLP

(57) ABSTRACT

Disclosed herein is a substrate including: a base substrate; an insulating layer formed on an upper portion of the base substrate; a circuit layer formed in a form in which it is buried in the insulating layer; at least one electrode formed on upper portions of the circuit layer and the insulating layer and having a prominence and depression formed at a side thereof; and a dielectric layer formed in a form in which it surrounds the side of the electrode.

6 Claims, 8 Drawing Sheets

SEMICONDUCTOR SUBSTRATE AND METHOD FOR MANUFACTURING SEMICONDUCTOR SUBSTRATE

CROSS REFERENCE TO RELATED APPLICATION

This application claims the benefit of Korean Patent Application No. 10-2012-0057372, filed on May 30, 2012, entitled "Semiconductor Substrate and Method for Manufacturing Semiconductor Substrate", which is hereby incorporated by reference in its entirety into this application.

BACKGROUND OF THE INVENTION

1. Technical Field

The present invention relates to a substrate and a method for manufacturing a substrate.

2. Description of the Related Art

An inductor is one of the main passive elements configuring an electronic circuit, together with a resistor and a capacitor. The inductor may be used as a component for removing noise or configuring an LC resonance circuit. The inductor may be classified into several types such as a multilayer type, a wire type, a thin film type, and the like, according to a structure thereof. Among them, the multilayer type inductor has been widely spread. The multilayer type inductor may be formed in a structure in which an insulating sheet and a coil formed of a conductor are multilayered (U.S. Pat. No. 6,154,114). The multilayer type inductor may be formed of separate components having a chip shape. Alternatively, the multilayer type inductor may be formed together with other modules in a state in which it is embedded in a substrate.

SUMMARY OF THE INVENTION

The present invention has been made in an effort to provide a substrate capable of improving adhesion between an electrode and a dielectric layer, and a method for manufacturing a substrate.

Further, the present invention has been made in an effort to provide a substrate, capable of preventing a separation of the electrode, and a method for manufacturing a substrate.

According to a preferred embodiment of the present invention, there is provided a substrate including: a base substrate; an insulating layer formed on an upper portion of the base substrate; a circuit layer formed in a form in which it is buried in the insulating layer; at least one electrode formed on upper portions of the circuit layer and the insulating layer and having a protrusion part and groove part formed at a side thereof; and a dielectric layer formed in a form in which it surrounds the side of the electrode.

The number of protrusion parts and groove parts formed in the electrode may be at least one.

The protrusion part and groove part may have a concave shape.

The protrusion part and groove part may have a convex shape.

The base substrate may include a magnetic material.

The circuit layer may include an inductor coil.

The dielectric layer may include a magnetic material.

The substrate may further include a solder electrode formed on the upper portion of the electrode.

According to another preferred embodiment of the present invention, there is provided a method for manufacturing a substrate, the method including: preparing a base substrate having an insulating layer and a circuit layer formed thereon; forming a seed layer on an upper portion of the insulating layer; forming a plating resist formed on an upper portion of the seed layer and including a protrusion part and groove part formed at a side thereof; forming an electrode on the upper portion of the seed layer exposed due to formation of the plating resist; removing the plating resist; removing the seed layer; and forming a dielectric layer on an upper portion of the insulating layer exposed due to removal of the plating resist and the seed layer.

In the forming of the seed layer, the seed layer may be formed by an electroless plating method.

The number of protrusion parts and groove parts may be at least one.

The protrusion part and groove part n may have a concave shape.

The protrusion part and groove part may have a convex shape.

In the forming of the electrode, the electrode may be formed by an electroplating method.

The circuit layer may include an inductor coil.

The base substrate may include a magnetic material.

The dielectric layer may include a magnetic material.

The method may further include, after the forming of the dielectric layer, forming a solder electrode on an upper portion of the electrode.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
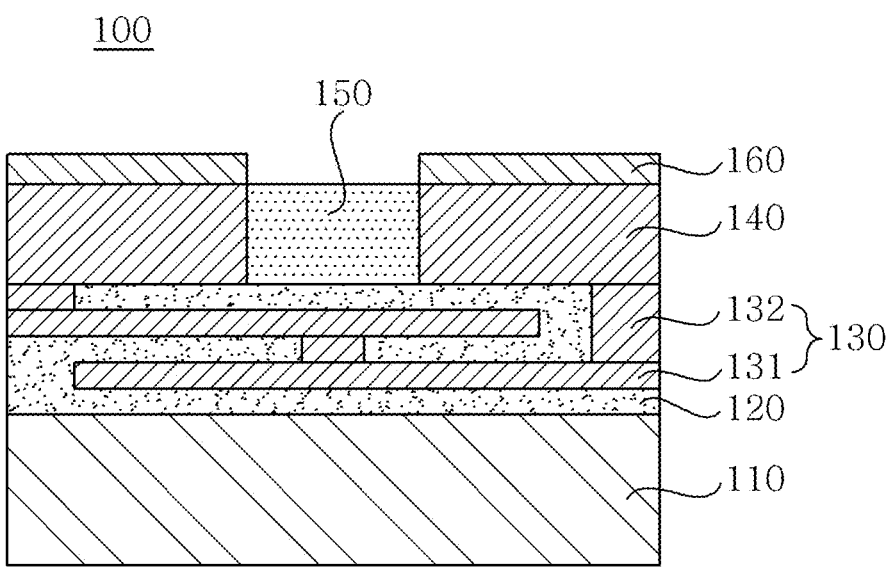
FIG. 1 is a view showing a substrate according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is a view showing a substrate according to a preferred embodiment of the present invention.

Referring to FIG. 1, the substrate 100 may include a base substrate 110, an insulating layer 120, a circuit layer 130, an electrode 140, and a dielectric layer 150.

The base substrate 110 may be made of a composite material including a magnetic material and a polymer resin. Here, the magnetic material may include a magnetic oxide having at least two elements selected from a group consisting of iron (Fe), nickel (Ni), cobalt (Co), manganese (Mn), magnesium (Mg), barium (Ba), strontium (Sr), and zinc (Zn). In addition, the magnetic material may be made of at least one material selected from a group consisting of a ferrite, a magnetic metal and an amorphous magnetic material. The polymer resin may be made of at least one material selected from a group consisting of an epoxy based, a phenol based, a nylon based and an elastomer.

The insulating layer 120 may be formed on an upper portion of the base substrate 110. The insulating layer 120 may be made of a non-magnetic insulating material such as an oxide, a nitride, or the like. Alternatively, the insulating layer 120 may be made of an insulating oxide magnetic material. Here, the insulating oxide magnetic material may be made of an oxide magnetic material having at least two elements selected from a group consisting of iron (Fe), nickel (Ni), cobalt (Co), manganese (Mn), magnesium (Mg), barium (Ba), strontium (Sr), and zinc (Zn). Since the insulating oxide magnetic material has high specific resistance, it may also have an electric insulation property.

The circuit layer 130 may be formed in a form in which it is buried in the insulating layer 120. The circuit layer 130 may be spaced apart from the upper portion of the base substrate 110 by the insulating layer 120. That is, the insulating layer 120 may be formed between a lower portion of the circuit layer 130 and the upper portion of the base substrate 110.

The circuit layer 130 may include an inductor coil 131. The inductor coil 131 may be formed in various shapes such as a rectangle, a square, a circle, and the like. In addition, the circuit layer 130 may include a via 132. The via 132 may be electrically connected to the inductor coil 131 and the electrode 140. The circuit layer 130 may be made of a conductive material. For example, the circuit layer 130 may be made of copper (Cu). The circuit layer 130 may be formed by various methods such as an electroplating method, a screen printing method, a cladding method of a metal thin film, and the like. The circuit layer 130 may be formed in a form in which it is buried in the insulating layer 120, and the insulating layer 120 may be provided between the inductor coils 131. Therefore, the inductor coils 131 may be electrically insulated from each other by the insulating layer 120 formed therebetween. Although the case in which the circuit layer 130 includes the inductor coil 131 and the via 132 has been described by way of example in the preferred embodiment of the present invention, the present invention is not limited thereto. That is, the circuit layer 130 may includes various kinds of circuit patterns.

The electrode 140 may be formed on upper portions of the circuit layer 130 and the insulating layer 120. In addition, at least one electrode 140 may be formed. The electrode 140 may be electrically connected to an external printed circuit board, or the like. The insulating layer 120 may be formed between the lower portion of the electrode 140 and the upper portion of the inductor coil 131 of the circuit layer 130. In this case, the electrode 140 may be electrically connected to the inductor coil 131 by the via 132 of the circuit layer 130. The electrode 140 may be made of a conductive material. For example, the electrode 140 may include at least one metal selected from a group consisting of copper (Cu), silver (Ag), gold (Au), and palladium (Pd). The electrode 140 as described above, which is not shown in FIG. 1, may be formed in a structure including protrusion part and groove part (not shown). At least one protrusion part and groove part (not shown) may be formed at a side of the electrode 140. A structure of the electrode 140 including the protrusion part and groove part (not shown) structure will be described with reference to FIGS. 2 to 5.

A solder electrode 160 may be formed on the upper portion of the electrode 140. The solder electrode 160 may be formed for improving adhesion with the printed circuit board.

The dielectric layer 150 may be formed in a shape in which it surrounds the side of the electrode 140. For example, in the case in which a plurality of electrodes 140 are formed, the dielectric layer 150 may be formed between the plurality of electrodes 140. The dielectric layer 150 may include a magnetic material. Here, the magnetic material may include a magnetic oxide having at least two elements selected from a group consisting of iron (Fe), nickel (Ni), cobalt (Co), manganese (Mn), magnesium (Mg), barium (Ba), strontium (Sr), and zinc (Zn). In addition, the magnetic material may be made of at least one material selected from a group consisting of a ferrite, a magnetic metal and an amorphous magnetic material. The polymer resin may be made of at least one material selected from a group consisting of an epoxy based, a phenol based, a nylon based and an elastomer.

FIGS. 2 to 5 are views showing an electrode structure according to the preferred embodiment of the present invention.

Figure 2:
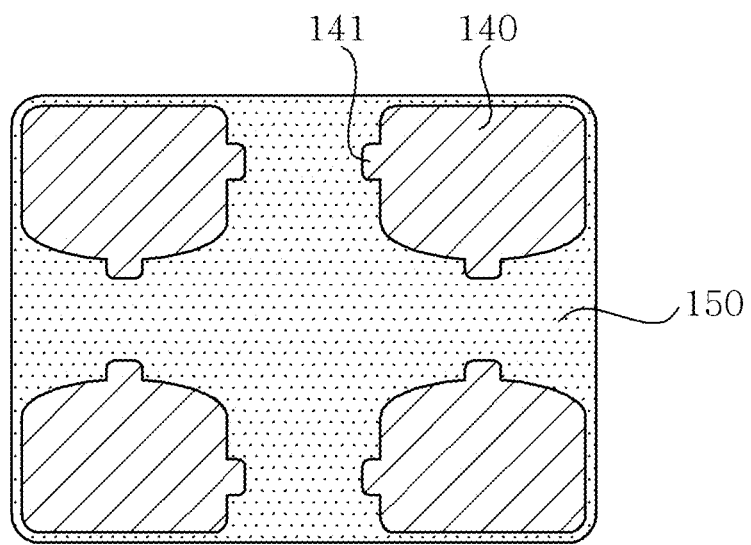
FIGS. 2 to 5 are views showing an electrode structure according to the preferred embodiment of the present invention.

FIG. 2 is a view showing an electrode having a convex protrusion and groove structure according to the preferred embodiment of the present invention.

Referring to FIG. 2, the electrodes 140 may be formed in edge portions of the base substrate 110, respectively. In addition, the electrode 140 may have a structure including a convex protrusion part 141 and groove part 142. The protrusion part and groove part 142 may be formed at the center of the side bonded to the dielectric layer 150 of the electrode 140, respectively. A bonding area between the electrode 140 and the dielectric layer 150 may be increased due to a structure of the electrode 140 having the convex protrusion part 141 and groove part 142. In this case, a distance between the electrodes 140 may be a distance enough to electrically insulate the electrodes 140 from each other. That is, a distance between the protrusion part 141 and groove part 142 formed at the side of the electrodes 140 may be a distance enough to electrically insulated the protrusion part 141 and groove part 142 from each other. The solder electrode 160 (See FIG. 1) may be formed on the upper portion of the electrode 140, which is not shown in FIG. 2. In this case, the solder electrode 160 (See FIG. 1) may have the same shape as that of the electrode 140 provided with the protrusion part 141 and groove part 142.

Figure 3:
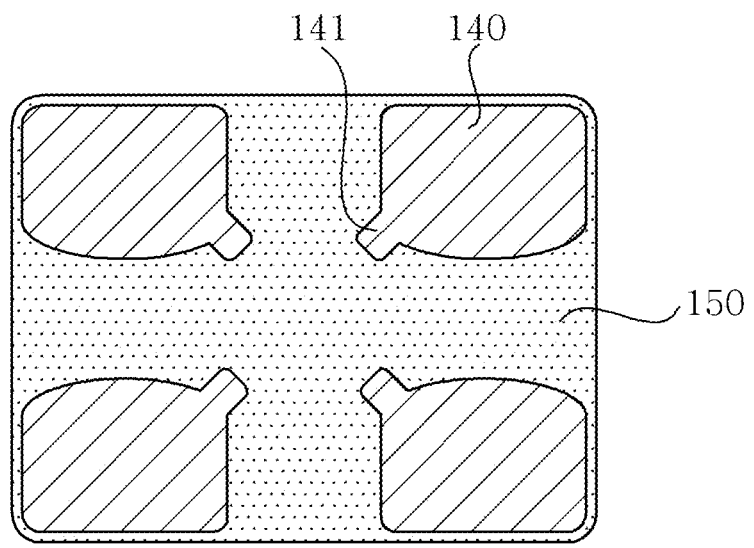

FIG. 3 is a view showing an electrode having a convex protrusion part and groove structure according to another preferred embodiment of the present invention.

Referring to FIG. 3, the protrusion part 141 and groove part 142 may be formed at edge portions of the electrode 140 bonded to the dielectric layer 150. In this case, a distance between the electrodes 140 may be a distance enough to electrically insulate the electrodes 140 from each other. That is, a distance between the protrusion part 141 and groove part 142 formed at the edge portions of the electrodes 140 may be a distance enough to electrically insulate the protrusion part 141 and groove part 142 from each other. The solder electrode 160 (See FIG. 1) may be formed on the upper portion of the electrode 140, which is not shown in FIG. 3. In this case, the solder electrode 160 (See FIG. 1) may have the same shape as that of the electrode 140 provided with the protrusion part 141 and groove part 142.

Figure 4:
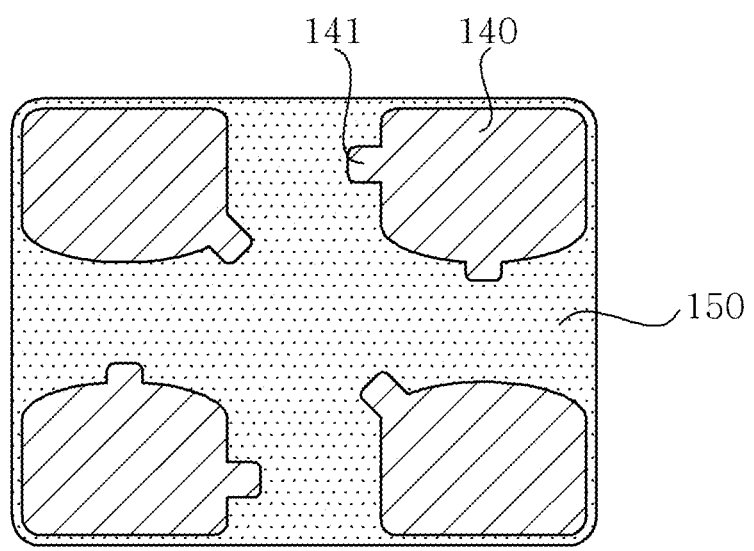

FIG. 4 is a view showing an electrode having a convex protrusion and groove structure according to another preferred embodiment of the present invention.

Referring to FIG. 4, the protrusion part 141 and groove part 142 may be formed at a side or an edge portion of the electrode 140 bonded to the dielectric layer 150. In this case, a distance between the electrodes 140 may be a distance enough to electrically insulate the electrodes 140 from each other. That is, a distance between the protrusion part 141 and groove part 142 formed at the side or the edge portion of the electrodes 140 may be a distance enough to electrically insulate the protrusion part 141 and groove part 142 from each other. The solder electrode 160 (See FIG. 1) may be formed on the upper portion of the electrode 140, which is not shown in FIG. 4. In this case, the solder electrode 160 (See FIG. 1) may have the same shape as that of the electrode 140 provided with the protrusion part 141 and groove part 142.

Figure 5:
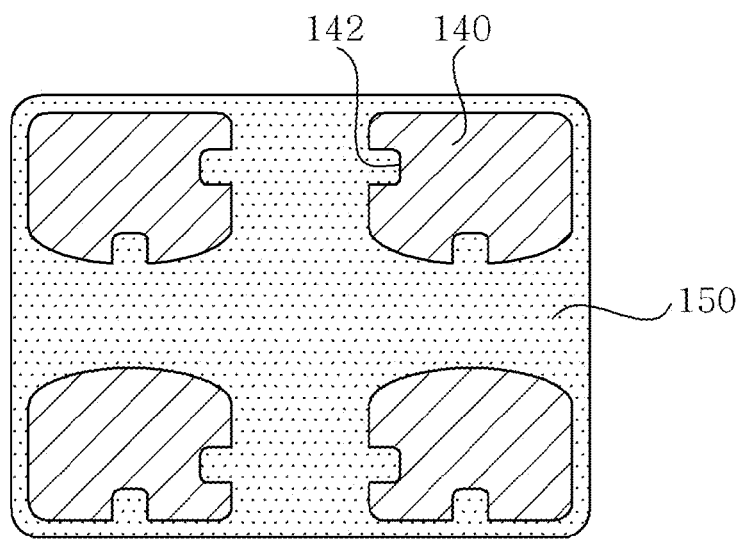

FIG. 5 is a view showing an electrode having a concave protrusion and groove structure according to the preferred embodiment of the present invention.

Referring to FIG. 5, the electrode 140 may have a structure including a concave protrusion part 141 and groove part 142. The concave protrusion part 141 and groove parts 142 may be formed at the center of the side bonded to the dielectric layer 150 of the electrode 140, respectively. A bonding area between the electrode 140 and the dielectric layer 150 may be increased due to a structure of the electrode 140 having the concave protrusion part 141 and groove part 142. In this case, a distance between the electrodes 140 may be a distance enough to electrically insulate the electrodes 140 from each other. The solder electrode 160 (See FIG. 1) may be formed on the upper portion of the electrode 140, which is not shown in FIG. 5. In this case, the solder electrode 160 (See FIG. 1) may have the same shape as that of the electrode 140 provided with the protrusion part 141 and groove part 142.

A structure of the electrode 140 having the protrusion and groove structure according to the preferred embodiment of the present invention has been described with reference to FIGS. 2 to 5. However, the structure of the electrode according to the preferred embodiment of the present invention is not limited to the structure shown in FIGS. 2 to 5. That is, the electrode may include the protrusion part and groove part having any structure capable of increasing the bonding area between the electrode and the dielectric layer. In addition, a size, a position, and the number of protrusion parts and groove parts formed in the electrode are not limited, but may be easily modified by those skilled in the art, as long as the electrodes may be electrically insulated from each other.

FIGS. 6 to 16 are views showing a method for manufacturing a substrate according to the preferred embodiment of the present invention.

Figure 6:
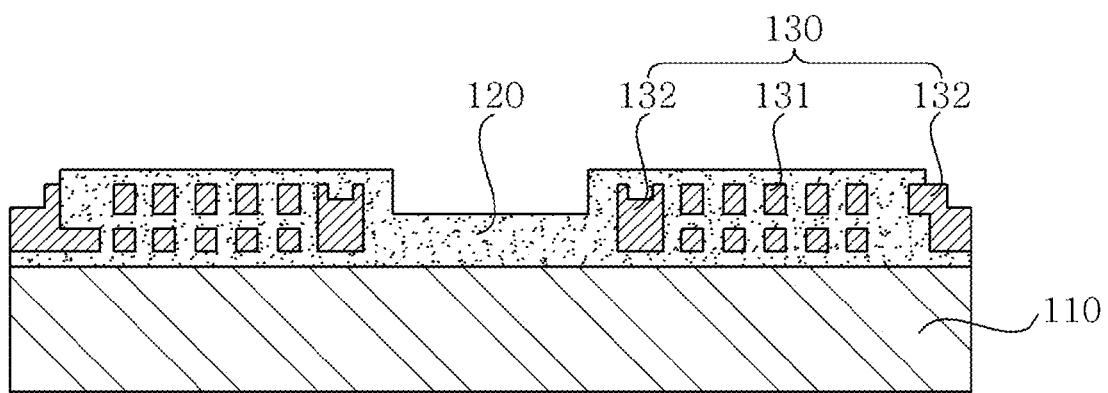
FIGS. 6 to 16 are views showing a method for manufacturing a substrate according to the preferred embodiment of the present invention.

Referring to FIG. 6, the base substrate 110 having the insulating layer 120 and the circuit layer 130 formed therein may be provided. The base substrate 110 may be made of a composite material including a magnetic material and a polymer resin. Here, the magnetic material may include a magnetic oxide having at least two elements selected from a group consisting of iron (Fe), nickel (Ni), cobalt (Co), manganese (Mn), magnesium (Mg), barium (Ba), strontium (Sr), and zinc (Zn). In addition, the magnetic material may be made of at least one material selected from a group consisting of a ferrite, a magnetic metal, and an amorphous magnetic material. The polymer resin may be made of at least one material selected from a group consisting of an epoxy based, a phenol based, a nylon based and an elastomer.

The insulating layer 120 and the circuit layer 130 may be formed on the upper portion of the base substrate 110.

The insulating layer 120 may be formed of a non-magnetic insulating layer such as an oxide, a nitride, or the like. Alternatively, the insulating layer 120 may be made of an insulating oxide magnetic material. Here, the insulating oxide magnetic material may be made of an oxide magnetic material having at least two elements selected from a group consisting of iron (Fe), nickel (Ni), cobalt (Co), manganese (Mn), magnesium (Mg), barium (Ba), strontium (Sr), and zinc (Zn). Since the insulating oxide magnetic material has high specific resistance, it may also have an electric insulation property.

The circuit layer 130 may be buried in the insulating layer 120. That is, the insulating layer 120 may be formed between the lower portion of the circuit layer 130 and the upper portion of the base substrate 110. That is, the circuit layers 130 may be spaced apart from the upper portion of the base substrate 110 by the insulating layer 120. Here, the insulating layer 120 may be formed on the upper portion of circuit layer 130.

The circuit layer 130 may include the inductor coil 131. The inductor coil 131 may be formed in various shapes such as a rectangle, a square, a circle, and the like. In addition, the circuit layer 130 may include a via 132. The via 132 may be electrically connected to the inductor coil 131 and the electrode 140. The circuit layer 130 may be made of a conductive material. For example, the circuit layer 130 may be made of copper (Cu). The circuit layer 130 may be formed by various methods such as an electroplating method, a screen printing method, a cladding method of a metal thin film, and the like. The circuit layer 130 may be formed in a shape in which it is buried in the insulating layer 120, and the insulating layer 120 may be provided between the inductor coils 131. Therefore, the inductor coils 131 may be electrically insulated by the insulating layer 120 formed between the inductor coils 131. Although the case in which the circuit layer 130 includes the inductor coil 131 and the via 132 has been described by way of example in the preferred embodiment of the present invention, the present invention is not limited thereto. That is, the circuit layer 130 may includes various kinds of circuit patterns.

The insulating layer 120 and the circuit layer 130 may be formed on the upper portion of the base substrate 110 by various methods. For example, the insulating layer 120 may be patterned by exposure and developing processes. However, a method for patterning the insulating 120 is not limited thereto. That is, the insulating layer 120 may be patterned by an etchant, a laser, or the like. As the insulating layer 120 is patterned as described above, the circuit layer 130 may be formed. Alternatively, for example, the insulating layer 120 may be formed of a plurality of insulating sheets. That is, a lower insulating sheet is formed on the upper portion of the base substrate 110, a lower circuit layer is formed, and an upper insulating sheet and an upper circuit layer are then formed on the lower circuit layer. By multilayering the insulating sheet and the circuit layer, the circuit layer 130 buried in the insulating layer 120 may be formed. That is, the insulating layer 120 and the circuit layer 130 may be formed on the upper portion of the base substrate 110 through various methods by those skilled in the art.

Figure 7:
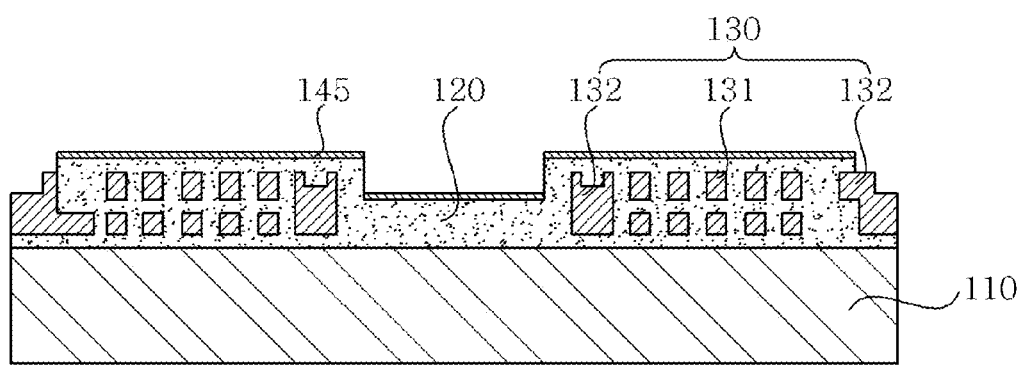

Referring to FIG. 7, a seed layer 145 may be formed on an upper portion of the insulating layer 120. The seed layer 145 may be formed by an electroless plating method. For example, the seed layer 145 may be formed by a sputtering method.

Figure 8:
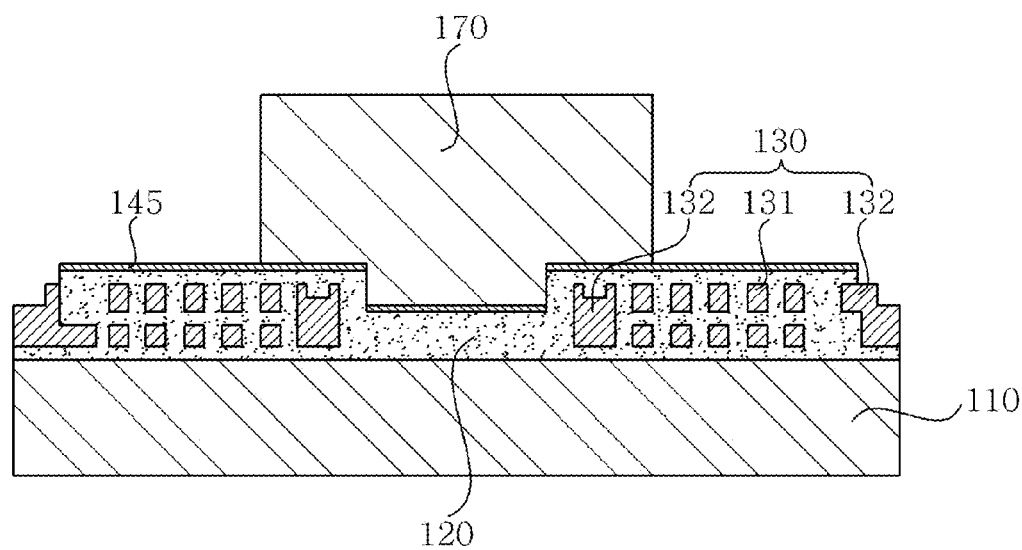
Figure 9:
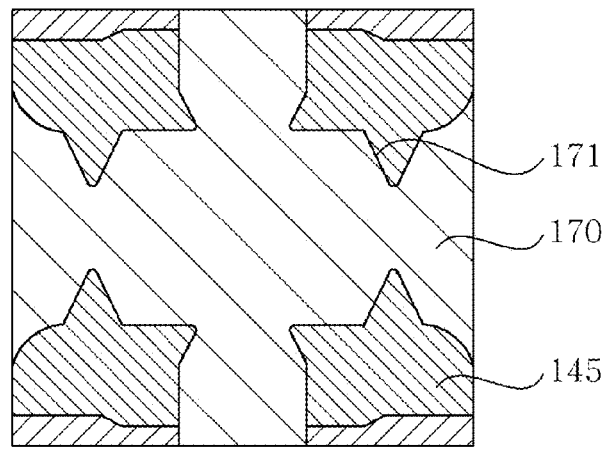
Figure 10:
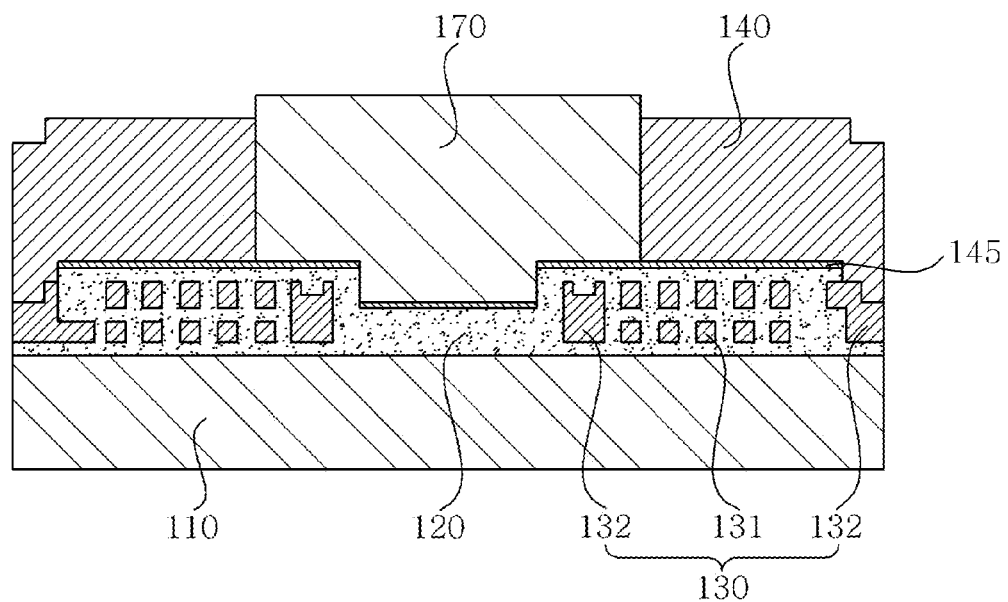
Figure 11:
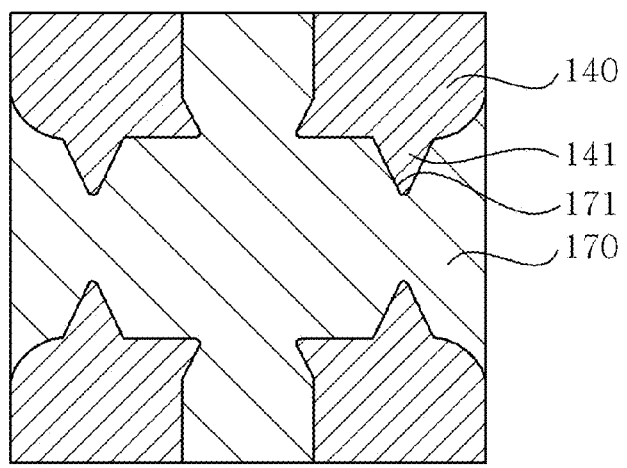

Referring to FIG. 8, a plating resist 170 may be formed on an upper portion of the seed layer 145. The plating resist 170 may be formed in a region other than an electrode (not shown) to be formed later. That is, the plating resist 170 may be patterned so that the seed layer 145 at a portion in which the electrode (not shown) is formed is exposed. In this case, the seed layer 145 exposed by the plating resist 170 may have a shape shown in FIG. 9. That is, the plating resist 170 may be formed in a structure including a concave protrusion part and groove part 171. The case in which the plating resist 170 includes the concave protrusion part and groove part 171 has been described by way of example in the preferred embodiment of the present invention. However, a pattern of the plating resist 170 is not limited thereto. For example, the pattern of the plating resist 170 may be formed so as to have a convex protrusion part and groove part (not shown). In addition, the number and a size of the protrusion part and groove part 171 of the plating resist 170 may be easily modified by those skilled in the art. Referring to FIG. 10, the electrode 140 may be formed on the upper portion of the seed layer 145 exposed by the plating resist 170. The electrode 140 may be formed by an electroplating method. In addition, the electrode 140 may be made of a conductive material. For example, the electrode 140 may include at least one metal selected from a group consisting of copper (Cu), silver (Ag), gold (Au), and palladium (Pd). As the electrode 140 is formed at a region other than a region in which the plating resist 170 is formed, the electrode 140 may have a structure including the convex protrusion part 141 and groove part 142. Alternatively, in the case in which the plating resist 170 is formed so as to have a convex protrusion part and groove part (not shown), the electrode 140 may be formed so as to have a concave protrusion part and groove part (not shown). That is, a shape of the electrode 140 may be modified according to the pattern of the plating resist 170. In this case, in the case in which the plurality of electrodes 140 are formed, a distance between the electrodes 140 may be a distance enough to electrically insulate the electrodes 140 from each other. That is, a distance between the protrusion part 141 and groove parts 142 formed at the side of the electrodes 140 may be a distance enough to electrically insulate the protrusion part 141 and groove part 142 from each other. The distance between the electrodes 140 as described above may be also determined by the pattern of the plating resist 170.

Figure 12:
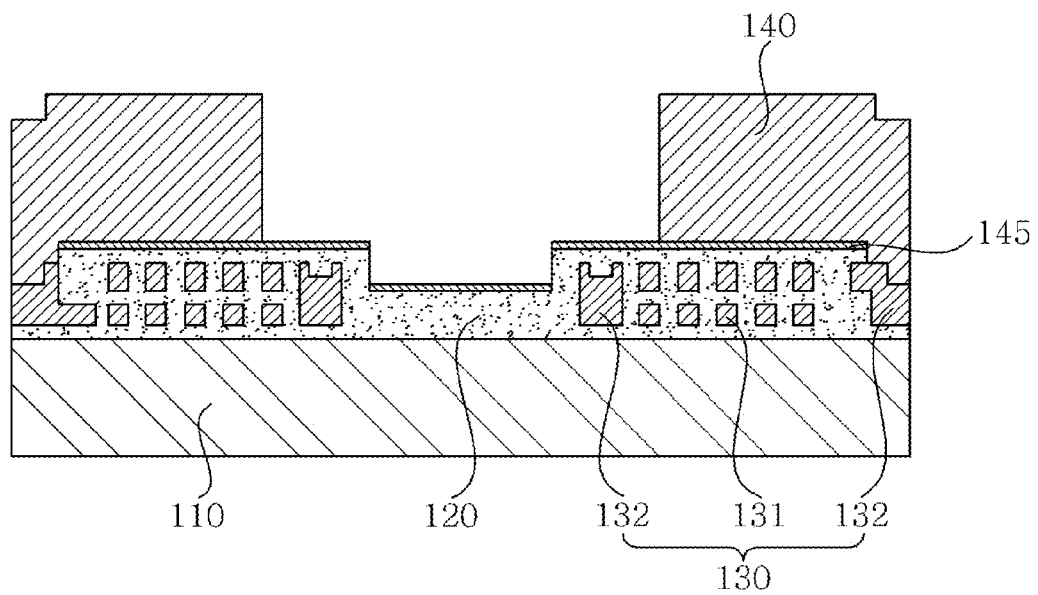

Referring to FIG. 12, after the electrode 140 is formed, the plating resist 17 may be removed.

Figure 13:
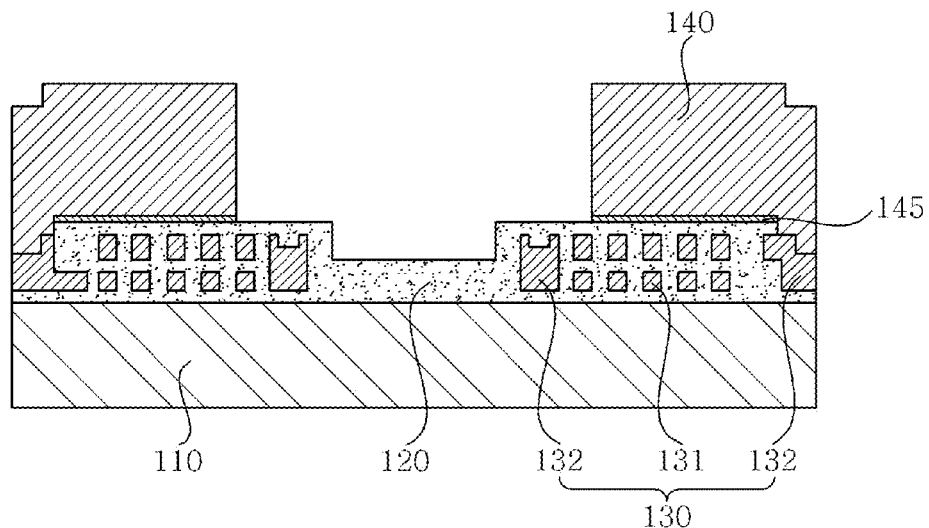

Referring to FIG. 13, the seed layer 145 may be removed. As the plating resist 170 is removed, the exposed seed layer 145 may be removed by an etchant, or the like.

Figure 14:
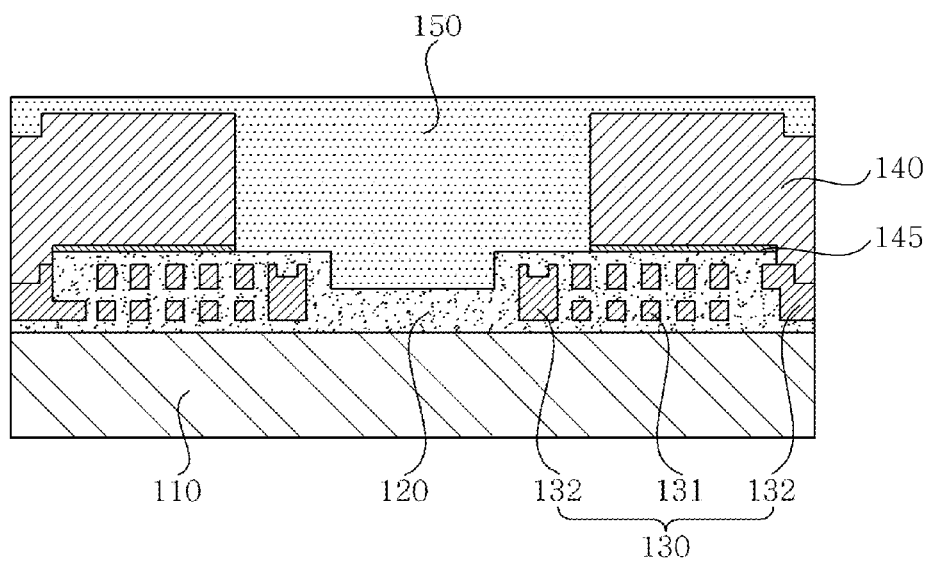

Referring to FIG. 14, the dielectric layer 150 may be formed on the upper portions of the exposed insulating layer 120 and the electrode 140. The dielectric layer 150 may include a magnetic material. Here, the magnetic material may include a magnetic oxide having at least two elements selected from a group consisting of iron (Fe), nickel (Ni), cobalt (Co), manganese (Mn), magnesium (Mg), barium (Ba), strontium (Sr), and zinc (Zn). In addition, the magnetic material may be made of at least one material selected from a group consisting of a ferrite, a magnetic metal, and an amorphous magnetic material. The polymer resin may be made of at least one material selected from a group consisting of an epoxy based, a phenol based, a nylon based and an elastomer.

Figure 15:
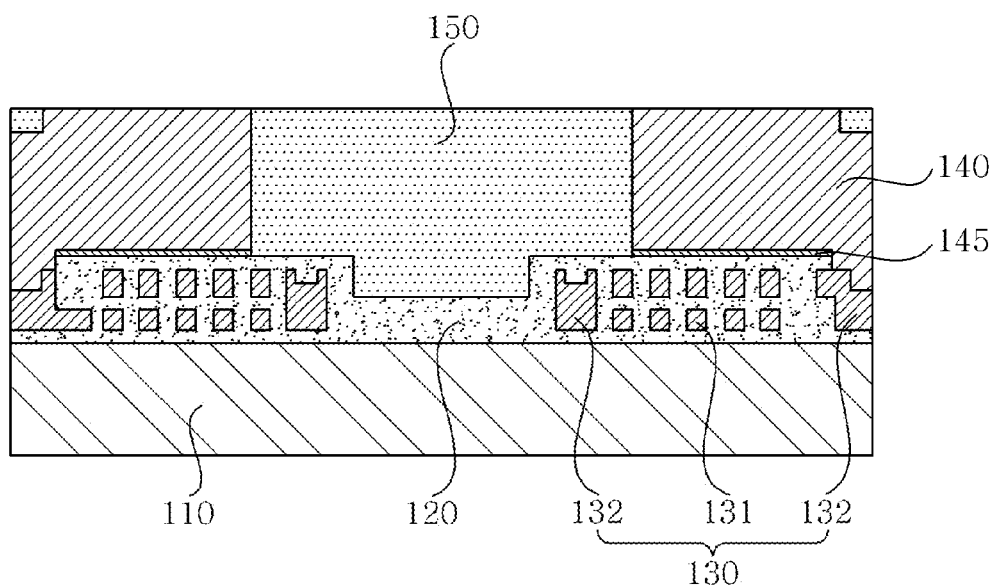
Figure 16:
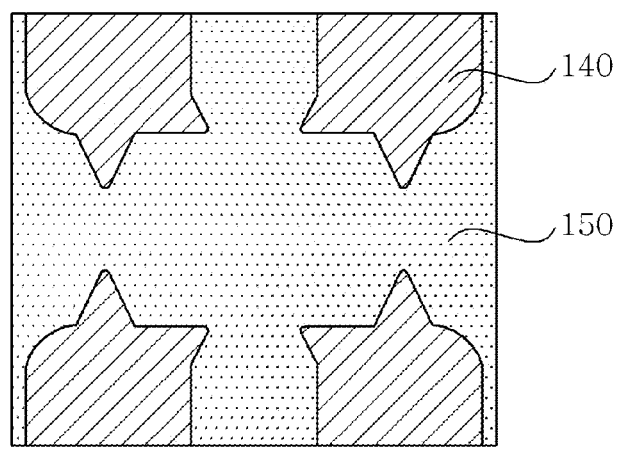

Referring to FIG. 15, the dielectric layer 150 formed on the upper portion of the electrode 140 may be polished. In this case, the dielectric layer 150 may be polished so that the upper portion of the electrode 140 is exposed. Through the polishing process as describe above, the dielectric layer 150 may be formed in a form in which it surrounds the side of the electrode 140 as shown in FIG. 16. For example, in the case in which a plurality of electrodes 140 are formed, the dielectric layer 150 may be formed between the plurality of electrodes 140. In addition, although not shown, the method for manufacturing a substrate according to the preferred embodiment of the present invention may further include, after the polishing process, a process for forming a solder electrode on the upper portion of the electrode 140. The solder electrode (not shown) may be formed for improving adhesion with a printed circuit board. The solder electrode (not shown) may be formed by an electroplating method. That is, the solder electrode (not shown) may be formed on the upper portion of the electrode 140 by immersing the upper portion of the electrode 140 in a solder liquid and then applying electricity to the solder liquid.

In the substrate and the method for manufacturing the substrate according to the preferred embodiment of the present invention, the electrode includes a protrusion and groove structure, thereby increasing a bonding area between the electrode and the dielectric layer. As the bonding area between the electrode and the dielectric layer becomes increased as described above, the adhesion between the electrode and the dielectric layer may be increased. Therefore, it is possible to prevent the electrode from being separated from the insulating layer.

As set forth above, with the substrate and the method for manufacturing the substrate according to the preferred embodiment of the present invention, the adhesion between the electrode and the dielectric layer may be improved.

In addition, with the substrate and the method for manufacturing the substrate according to the preferred embodiment of the present invention, the separation of the electrode may be prevented.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A substrate comprising:
   a base substrate;
   an insulating layer formed on an upper portion of the base substrate;
   a circuit layer formed in a form in which it is buried in the insulating layer;
   at least one electrode formed on upper portions of the circuit layer and the insulating layer and having a protrusion part or a groove part, or a combination thereof formed at a side thereof; and
   a dielectric layer formed in a form in which it surrounds the side of the electrode,
   wherein the protrusion part and the groove part are a dummy member to increase a bonding area between the electrode and the dielectric layer, and are not electrically interconnected with any conductor members.

2. The substrate as set forth in claim 1, wherein the number of protrusion part and groove part formed in the electrode is at least one.

3. The substrate as set forth in claim 1, wherein the base substrate includes a magnetic material.

4. The substrate as set forth in claim 1, wherein the circuit layer includes an inductor coil.

5. The substrate as set forth in claim 1, wherein the dielectric layer includes a magnetic material.

6. The substrate as set forth in claim 1, further comprising a solder electrode formed on the upper portion of the electrode.

* * * * *